(12) United States Patent
Kristal

(10) Patent No.: US 10,903,393 B2
(45) Date of Patent: Jan. 26, 2021

(54) TRANSFER TEMPLATE, DISPLAY SUBSTRATE, DISPLAY PANEL, AND METHOD FOR MANUFACTURING THE SAME

(71) Applicant: BOE Technology Group Co., Ltd., Beijing (CN)

(72) Inventor: Boris Kristal, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 16/137,311

(22) Filed: Sep. 20, 2018

(65) Prior Publication Data
US 2019/0280152 A1 Sep. 12, 2019

(30) Foreign Application Priority Data

Mar. 8, 2018 (CN) .......................... 2018 1 0191299

(51) Int. Cl.
| | | |
|---|---|---|
| H01L 21/02 | (2006.01) | |
| H01L 23/14 | (2006.01) | |
| H01L 51/50 | (2006.01) | |
| H01L 33/06 | (2010.01) | |

(52) U.S. Cl.
CPC ........ *H01L 33/06* (2013.01); *H01L 21/02104* (2013.01); *H01L 23/142* (2013.01); *H01L 51/5056* (2013.01); *H01L 51/5072* (2013.01)

(58) Field of Classification Search
CPC combination set(s) only.
See application file for complete search history.

(56) References Cited

U.S. PATENT DOCUMENTS

| | | | |
|---|---|---|---|
| 6,207,369 B1 * | 3/2001 | Wohlstadter ........... | G01N 21/66 204/400 |
| 10,026,913 B2 | 7/2018 | Kim et al. | |
| 2004/0191564 A1 | 9/2004 | Kim et al. | |
| 2017/0256730 A1* | 9/2017 | Kim ..................... | C09D 11/037 |
| 2018/0277782 A1 | 9/2018 | Kim et al. | |

FOREIGN PATENT DOCUMENTS

| | | | |
|---|---|---|---|
| CN | 106299144 A * | 1/2017 | ........... H01L 51/502 |
| CN | 106299144 A | 1/2017 | |
| CN | 107004737 A | 8/2017 | |

OTHER PUBLICATIONS

Office Action issued in corresponding Chinese Patent Application No. 201810191299.1, dated Dec. 16, 2019.

* cited by examiner

Primary Examiner — Michelle Mandala
Assistant Examiner — Jordan M Klein
(74) Attorney, Agent, or Firm — McDermott Will & Emery LLP

(57) ABSTRACT

A transfer template, a display substrate, a display panel, and a method for manufacturing the same are provided in the embodiments of the disclosure, the transfer template being configured to transfer a material to be transferred, including: a transfer substrate; and a plurality of transfer units arranged on the transfer substrate and spaced apart from one another; an adhesive force between the plurality of transfer units and the material to be transferred is configured to be larger than another adhesive force between the transfer substrate and the material to be transferred.

13 Claims, 7 Drawing Sheets

TRANSFER TEMPLATE, DISPLAY SUBSTRATE, DISPLAY PANEL, AND METHOD FOR MANUFACTURING THE SAME

CROSS-REFERENCE TO RELATED INVENTION

The present disclosure claims the benefit of Chinese Patent Application Invention No. 201810191299.1 filed on Mar. 8, 2018 in the State Intellectual Property Office of China, the whole disclosure of which is incorporated herein by reference.

TECHNICAL FIELD

Embodiments of the present disclosure relate to the technical field of display technologies, and especially to a transfer template, a display substrate, a display panel, and a method for manufacturing the same.

BACKGROUND

Quantum dot light emitting diodes (abbreviated as QLED) utilizes quantum dots (abbreviated as QD) to emit light; and due to properties of quantum dots comprising: relatively high purity, relatively high luminous efficiency, relatively strong tolerance/resistance to water and oxygen, and stable and reliable performance and the like, such that QLED technology is widely applied in technical fields of display and illumination and the like, so as to prepare display products and lighting products of superior properties.

SUMMARY

According to an aspect of the exemplary embodiment of the present disclosure, there is provided a transfer template configured to transfer a material to be transferred, comprising: a transfer substrate; and a plurality of transfer units arranged on the transfer substrate and spaced apart from one another; an adhesive force between the plurality of transfer units and the material to be transferred is configured to be larger than another adhesive force between a portion of the transfer substrate among the plurality of transfer units and the material to be transferred.

According to an embodiment of the disclosure, the transfer template comprises a base layer and a metallic layer stacked on each other, with the plurality of transfer units being on a side of the metallic layer facing away from the base layer.

According to an embodiment of the disclosure, the plurality of transfer units collectively function as a self-assembled monolayer film.

According to an embodiment of the disclosure, the self-assembled monolayer film is a self-assembled thiol molecular film.

According to an embodiment of the disclosure, a material of the plurality of transfer units carries first functional groups, and the material to be transferred carries second functional groups; and the plurality of transfer units are configured to be in contact with the material to be transferred, and the first functional groups and the second functional groups attract each other.

According to an embodiment of the disclosure, the material to be transferred is a quantum dot material; the first functional groups are one type of amino groups and zirconium ionic groups; and the second functional groups are one type of sulfonic acid groups, phosphoric acid groups, and carboxylic acid groups.

According to an embodiment of the disclosure, the material to be transferred further carries hydrophobic units on which the second functional groups are located; and the hydrophobic units comprise repeating units formed by one type of phenylene ethynylene groups and phenylene vinylidene groups.

According to another aspect of the exemplary embodiment of the present disclosure, there is provided a method for manufacturing a transfer template, the transfer template being configured to transfer a material to be transferred, comprising: forming a transfer substrate; and forming a plurality of transfer units arranged on the transfer substrate and spaced apart from one another; an adhesive force between the plurality of transfer units and the material to be transferred is set to be larger than another adhesive force between the transfer substrate and the material to be transferred.

According to an embodiment of the disclosure, forming a transfer template comprises: providing a base layer; and forming a metallic layer on the base layer; the plurality of transfer units are formed on the metallic layer.

According to an embodiment of the disclosure, forming a plurality of transfer units comprises: forming a transfer layer on the metallic layer; and forming the plurality of transfer units by patterning the transfer layer.

According to still another aspect of the exemplary embodiment of the present disclosure, there is provided a method for manufacturing a display substrate, comprising: forming the material to be transferred on the transfer template as above; forming a base substrate on a surface of which a functional layer is formed; aligning the transfer template with the base substrate; laminating the material to be transferred which is formed on the transfer template, onto the functional layer of the base substrate; and removing the transfer template to leave the material to be transferred which is located among the plurality of transfer units to be adhered to the functional layer; a still another adhesive force between the material to be transferred and the functional layer is set to be smaller than the adhesive force between the plurality of transfer units and the material to be transferred, but to be larger than the another adhesive force between the transfer substrate of the transfer template and the material to be transferred.

According to an embodiment of the disclosure, a material of the plurality of transfer units carries first functional groups and the material to be transferred is a quantum dot material, and prior to forming the material to be transferred on the transfer template as above, the method further comprising: processing the quantum dot material by a ligand-exchange reaction such that the quantum dot material carries hydrophobic units; and modifying the quantum dot material carrying the hydrophobic units such that the hydrophobic units carries second functional groups; in response to the plurality of transfer units being in contact with the material to be transferred, the first functional groups and the second functional groups attract each other.

According to an embodiment of the disclosure, the functional layer is one of an electron-transporting material layer and a hole-transporting material layer.

According to yet another aspect of the exemplary embodiment of the present disclosure, there is provided a display substrate manufactured by the method as above.

According to still yet another aspect of the exemplary embodiment of the present disclosure, there is provided a display panel, comprising: a housing; and the display substrate as above, which is accommodated within the housing.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF EMBODIMENTS

Figure 1:
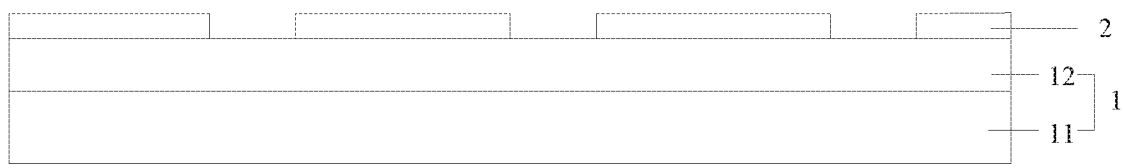
FIG. 1 illustrates a schematic structural view of a transfer template according to an embodiment of the disclosure.

Above technical purposes, features and advantages of the embodiments of the disclosure may be more apparent and more easily perceivable, by describing hereinafter in detail embodiments of the disclosure with reference to the accompanying drawings.

In depictions of the embodiments of the disclosure, unless it is defined definitely otherwise, it should be comprehended that, an expression "a plurality of/the plurality of" means at least two, such as two, three, etc.; and any orientative or positional relationship indicated by terminologies "upper", "lower", "left", "right", "inner", "outer" and so on is based on orientative or positional relationship as illustrated in accompanied drawings, only intending to facilitate and simplify depictions of embodiments of the disclosure, rather than indicating or implying that such referred device or element should necessarily have a specific orientation, or be constructed in a specific orientation or operate in a specific orientation, therefore, such terminologies should not be comprehended as limitations to embodiments of the disclosure.

In embodiments of the disclosure, unless being explicitly specified and defined in the context otherwise, terminologies such as "mount", "connect", "connect(ed) . . . with", and the like are intended to be inclusive and should thus be comprehended in a broad sense, e.g., may be interpreted as fixed connection or detachable connection, or even integrated connection; and may be a mechanical connection, or an electrical connection, or communication with each other or one another; and may be direct connection, or indirection connection via an intermediate medium, or an internal communication between two elements, or even an interaction relationship between two elements. As to those skilled in the art, specific meanings of above terminologies in embodiments of the disclosure may be comprehended according to specific context herein.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings re only intended to exemplarily illustrate the contents of the disclosure, rather than to demonstrate the practical dimension or proportion of components of a transfer template, a display substrate, a display panel.

According to a general technical concept of embodiments of the present disclosure, in an aspect of the embodiments of the disclosure, it is provided a transfer template configured to transfer a material to be transferred, comprising: a transfer substrate; and a plurality of transfer units arranged on the transfer substrate and spaced apart from one another, with an adhesive force between the plurality of transfer units and the material to be transferred being set to be larger than another adhesive force between a portion of the transfer substrate among the plurality of transfer units and the material to be transferred.

The transfer template is configured to transfer the material to be transferred; upon transferring, the material to be transferred is formed onto the transfer template through the plurality of transfer units, and specifically formed on a portion of the transfer substrate between any one of the plurality of transfer units which is acting on the transfer template and adjacent one(s) of the plurality of transfer units. By way of example, as per requirements in transfer, specific type of the material to be transferred may be selected, for example, the material to be transferred may be a quantum dot material or any other applicable material, and both the material to be transferred and the transfer template may meet requirements on adhesive forces as above. The material to be transferred may for example be formed on the transfer template in various ways, e.g., by coating, spraying and the like, e.g., as per practical requirements.

Structures and sizes of the transfer substrate and the plurality of transfer units in the transfer template may for example be set as per practical requirements.

When the plurality of transfer units and the transfer template are used to transfer the material to be transferred, once the material to be transferred has already been transferred onto the portion of the transfer substrate between any one of the plurality of transfer units which is acting on the transfer template and adjacent one(s) of the plurality of transfer units to be transferred, by the plurality of transfer units, then in subsequent processes, the material to be transferred having a relatively strong adhesiveness with the plurality of transfer units may still remain adhered onto the plurality of transfer units, while the material to be transferred having a relatively weak adhesiveness with the plurality of transfer units may be transferred to a target object (e.g., a display substrate to which the material to be transferred (for example, the quantum dot material) is to be transferred). Based on above mechanism of transferring, for example, by adjusting a pattern and sizes of the portion of the transfer substrate which is not covered by the plurality of transfer units, a pattern and sizes of the material to be transferred which is already transferred onto the target object may be varied. At the same time, by the processing as above, the pattern of the material to be transferred which is already transferred onto the target object has properties such as clear edges, a uniform and relatively thin thickness of each film layer.

Figure 2:
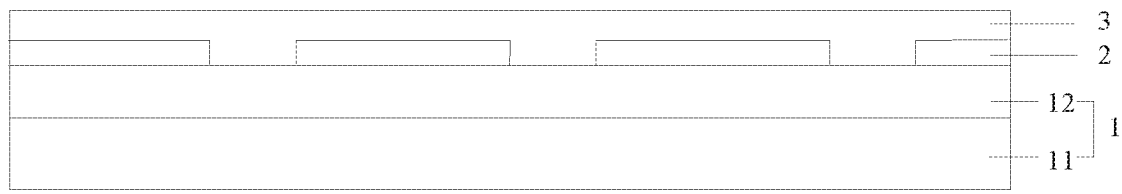
FIG. 2 illustrates a schematic structural view of a material to be transferred which is formed on the transfer template as illustrated in FIG. 1.

Exemplarily, referring to FIG. 1, the transfer template as illustrated therein comprises a transfer substrate 1 and a plurality of transfer units 2 arranged on the transfer substrate 1 and spaced apart from one another, the transfer substrate 1 comprising a base layer 11 and a metallic layer 12 stacked on each other, with the plurality of transfer units 2 being provided on a side of the metallic layer 12 facing away from the base layer. When the plurality of transfer units and the transfer template as illustrated in FIG. 1 are used to transfer the material to be transferred, the material to be transferred is formed to be arranged continuously on various transfer units 2, and on portions of the metallic layer 12 between any adjacent two transfer units of the plurality of transfer units, as illustrated in FIG. 2, so as to form a material layer 3 to be transferred. In a condition that the material to be transferred is the quantum dot material, then the material layer 3 to be transferred thus formed is a quantum dot layer.

In practice, by way of example, prior to forming the material to be transferred on the transfer template, portions of the metallic layer 12 between any adjacent two transfer units of the plurality of transfer units have been further etched off already; as such, the material layer 3 to be transferred for example covers not only the plurality of transfer units 2, but also covers directly portions of the base layer 11 between any adjacent two transfer units of the plurality of transfer units 2.

Based on different types of material, the plurality of transfer units 2 may for example be of several kinds, for example, the plurality of transfer units are for example formed by a self-assembled monolayer film (abbreviated as SAM hereinafter) which is formed by a self-assembled material, e.g., a self-assembled molecular monolayer; in other words, once formed, the plurality of transfer units still function as the self-assembled monolayer film, collectively. The SAM film is a molecular monolayer which is adsorbed spontaneously on a surface of the metallic layer and thus formed to be thermodynamically stable and low in energy thereof, specifically achieved by an interaction implemented among chemical bonds of molecules of the self-assembled material; and therefore, a firm adhesion between the SAM film and the metallic layer may be obtained.

There are various SAM films, e.g., a self-assembled thiol molecular film which is firmly formed on the metallic layer 12 by an interaction e.g., between thiol groups carried by the self-assembled thiol molecular film and the metallic material of the metallic layer 12.

And there are various materials for the base layer 11, e.g., glass, or transparent organic polymer such as one or more of polyester, poly-acrylic acid, poly-epoxy resin, polydimethylsiloxane, polyethylene, polystyrene and the like. Correspondingly, the base layer 11 may for example comprise a glass layer or a transparent organic polymer layer.

The metallic layer 12 is formed on the base layer 11. There may for example be various materials for forming the metallic layer 12, and sizes of the metallic layer 12 such as thickness thereof and the like may for example be set depending on practical conditions. By way of example, the metallic layer 12 for example comprises a first metal layer and a second metal layer stacked on each other, the first metal layer being in turn disposed on the base layer 11. The first metal layer is for example a primer layer or an adhesive layer formed by one or more materials comprising metallic titanium, metallic chrome, and metallic nickel and the like, with a thickness thereof ranging between 1 nm and 5 nm. And the second metal layer is for example a metal layer formed by a coinage metal material or a precious metal material, such as platinum, palladium, gold, silver, copper and the like, with a thickness thereof ranging between 10 nm and 200 nm. As to parameters of the base layer 11 and the metallic layer 12 such as material, thickness and the like, above embodiments are only exemplary, without being limited in any aspect; in other words, any applicable materials and sizes may be adopted.

In an embodiment of the disclosure, in order to increase the adhesive force between the plurality of transfer units and the material to be transferred, by way of example, it is defined that the material of the plurality of transfer units carries first functional groups, and the material to be transferred carries second functional groups; and in response to a condition in which the plurality of transfer units are in contact with the material to be transferred, there exists an interaction in a form of a mutual attraction between the first functional groups and the second functional groups, such that the material to be transferred is for example formed firmly on the plurality of transfer units.

By way of example, specific types of the first functional groups and the second functional groups are selected depending on practical conditions. For example, in a condition that the material to be transferred is a quantum dot material, the first functional groups may for example be amino groups or zirconium ionic groups; and the second functional groups may for example be sulfonic acid groups, phosphoric acid groups, or carboxylic acid groups. In practice, the material of the plurality of transfer units may for example carry both thiol groups and amino groups. As to specific types of the first functional groups and the second functional groups, above embodiments are only exemplary, without being limited in any aspect; in other words, any applicable functional groups may be adopted.

In a condition that two materials which are in contact with each other and carry functional groups charged oppositely, respectively, a magnitude of an adhesive force between the two materials may for example be characterized by a magnitude of an interaction force between the two materials. As a specific exemplary embodiment, in a condition that the functional groups carried within the material of the plurality of transfer units are charged opposite to the functional groups carried within the material to be transferred, a magnitude of the adhesive force between the plurality of transfer units and the material to be transferred may for example be characterized by a magnitude of the interaction force therebetween.

In an embodiment of the disclosure, for example, the material to be transferred further carries hydrophobic units so as to provide the material to be transferred with a relatively strong hydrophobic property. By way of example, a specific structure of the hydrophobic units may be set depending on practical conditions. For example, in a condition that the material to be transferred is a quantum dot material, the quantum dot material for example carries the hydrophobic units which for example comprise repeating units formed by monomers of phenylene ethynylene groups or monomers of phenylene vinylidene groups, the repeating units being constructed in a form of conjugated chains, with specific number of monomers in each repeating unit being set depending on practical conditions; e.g., a repeating unit has 2-8 monomers therein. As to the specific structure, the material to be transferred may for example carry hydrophobic units which carry the second functional groups.

Based on settings of the functional groups and the like as above, the quantum dot layer formed by the material to be transferred may for example be adhered firmly to the plurality of transfer units, with merely a relatively week interaction being created between the quantum dot luminescent material of the quantum dot layer (with a surface energy for example being less than 50 mJ/m$^2$) and the material of the transfer substrate between any two adjacent transfer units. Therefore, by the transfer substrate which is provided with the self-assembled molecular monolayer and the metallic layer both formed thereon and thus functions as an auxiliary substrate, since the adhesive force created between the quantum dot material for forming the material layer to be transferred and the self-assembled molecular monolayer for forming the plurality of transfer units is larger than the adhesive force created between the quantum dot material and the transfer substrate which functions as the auxiliary substrate between the plurality of transfer units, it facilitates that the quantum dot material provided corresponding to (e.g., at least partially overlapping with) the portions of the metallic layer may be transferred to the display substrate functioning as the target object. In addition, in a condition that the quantum dot luminescent material for example comprises the repeating units formed either monomers of phenylene ethynylene groups or monomers of phenylene vinylidene groups, functional ligands may be constructed in a form of rigid flat chains, tending to form a solid-state π stacking; and in turn, due to the existence of the solid-state π stacking, there may be a relatively strong hydrophobic effect among the functional ligands of the quantum dot luminescent material, resulting in a relatively strong hydrophobic property of the quantum dot luminescent material.

Figure 3:
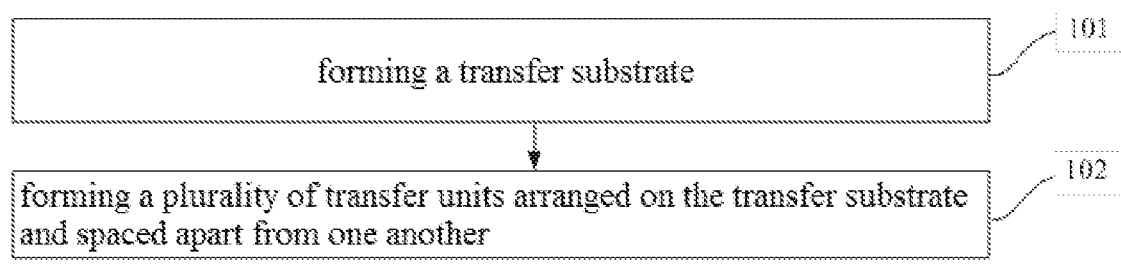
FIG. 3 illustrates a flow chart of a method for manufacturing the transfer template according to the embodiment of the disclosure.

In another aspect of the embodiments of the disclosure, a method for manufacturing the transfer template as above is further provided. As illustrated in FIG. 3, the method for manufacturing the transfer template comprises:

Step 101, forming the transfer template.

The transfer template provided in an embodiment of the disclosure comprises a transfer substrate, and other structures of the transfer template which are formed on the transfer substrate. By way of example, during a process in which the transfer template is manufactured, the transfer substrate is manufactured above all, and said other structures may in turn be selectively manufactured on the transfer substrate.

The transfer substrate as above may for example comprise a base layer and a metallic layer stacked on each other, and then the step for forming the transfer template may for example comprise: firstly, providing a base layer; secondly, forming a metallic layer on the base layer, on which metallic layer a plurality of transfer units are to be formed.

Step 102, forming a plurality of transfer units on the transfer substrate, the plurality of transfer units being spaced apart from one another.

After the transfer substrate is formed, the plurality of transfer units are formed on the transfer substrate and arranged to be spaced apart from one another.

Specifically, in a condition that the transfer substrate comprises the base layer and the metallic layer stacked with each other, depending on a specific type of material of and a specific structure of the transfer substrate, the step of forming the plurality of transfer units for example comprises:

Firstly, forming a transfer layer on the metallic layer, the transfer layer being structured to be entirely an integral layer formed by a material for forming the plurality of transfer units.

There may be various ways of forming the transfer layer on the metallic layer, for example, the transfer layer which carries thiol groups may be assembled on the metallic layer, by impregnating the metallic layer which has been newly prepared or has been cleaned, into a polymer functional reagent which carries functional groups, and then by a self-assembling of polymers. The functional reagent may for example be an allyl thiol solution of one of the following various materials, such as, ethanol, tetrahydrofuran, dimethylformamide, acetonitrile, cyclooctane, methylbenzene, and the like. More specifically, for example, the allyl thiol solution may have a concentration thereof which is set depending on practical conditions. By way of example, a temperature of the allyl thiol solution maybe set depending on practical conditions, facilitating the self-assembling process such that the transfer layer is formed on the metallic layer, e.g., the temperature of the allyl thiol solution may for example be 25~50° C.

Secondly, forming the plurality of transfer units, by patterning the transfer layer.

A patterning process is implemented on the transfer layer depending on practical requirements, so as to form the plurality of transfer units. There may be several ways for implementing the patterning process, such as, implementing an exposure process on the transfer layer with ultraviolet light by taking advantage of a shielding effect of a mask or a reticle, etching the plurality of transfer units, and the like.

By way of example, a specific structure of the mask or reticle may be set, depending on requirements on patterns and sizes of the material to be transferred, such that the transfer template has a functionality of transferring the material to be transferred having a desired pattern and desired sizes.

For example, above all, in a condition that the transfer substrate comprises the base layer and the metallic layer stacked on each other, the transfer layer which carries thiol groups is formed on the metallic layer, i.e., by a interaction between the thiol groups carried by the transfer layer and the metallic layer, the transfer layer is formed firmly on the metallic layer.

Next, illuminating the transfer layer with ultraviolet light by taking advantage of a shielding effect applied by the mask or the reticle, such that the thiol groups carried by at least a portion of the material of the transfer layer may be exposed to ultraviolet light and in turn transferred to sulfonate groups; specifically, during the exposure to ultraviolet light, a photolysis reaction occurs in the transfer layer exposed to the illumination of the ultraviolet light, such that the thiol groups carried by the material of the transfer layer exposed to the illumination of the ultraviolet light are transformed into sulfonate groups, and the portion of the material of the transfer layer exposed to the illumination of the ultraviolet light is transformed into alkane sulfonate, while the other portion of the material of transfer layer which fails to be exposed to the illumination of the ultraviolet light remains adhered firmly onto the metallic layer.

Finally, the transfer layer which was once illuminated is impregnated into the solution so as to remove a portion of the material carrying the sulfonate groups, such that 'the other portion of the material of the transfer layer', which remains adhered firmly onto the metallic layer since it fails to be exposed to the illumination of the ultraviolet light, may be transformed into the plurality of transfer units spaced apart from one another and arranged on the metallic layer.

The solution for impregnating the transfer layer which was once illuminated is configured to dissolve the portion of the material carrying the sulfonate groups. For example, there may be various solutions, such as reagent water and the like, e.g. which may be selected depending on practical conditions.

Thirdly, e.g., after the plurality of transfer units are formed on the metallic layer, e.g., etching a portion of the metallic layer which is not covered by the plurality of transfer units so as to expose a portion of the base layer located between any two adjacent transfer units, and in turn forming a portion of the quantum dot layer on the portion of the base layer located between any two adjacent transfer units.

In order to ensure that the method for manufacturing the transfer template according to an embodiment of the disclosure may be understood more readily and clearly by those skilled in the art, at present, the method for manufacturing the transfer template may be set forth in detail by following exemplary embodiments.

EXEMPLARY EMBODIMENTS

Figure 4:
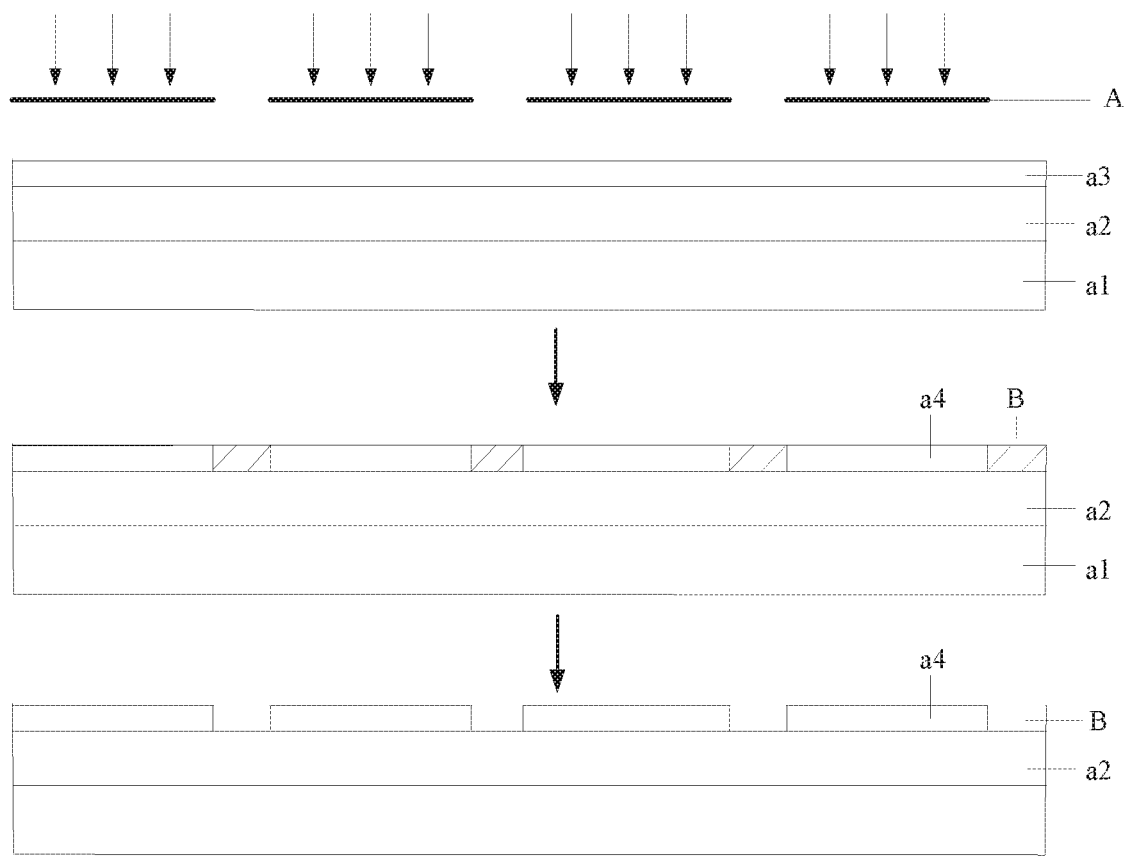
FIG. 4 illustrates a schematic view of workflows of the method for manufacturing the transfer template according to the embodiment of the disclosure.

Specifically, FIG. 4 illustrates a schematic view of workflows of the method for manufacturing the transfer template according to the embodiment of the disclosure. Also with reference to FIG. 3, the method for manufacturing the transfer template comprises:

A first step: selecting a base layer a1, and forming a metallic layer a2 and a transfer layer a3 sequentially on the base layer a1.

A second step: illuminating the transfer layer a3 with ultraviolet light rays by using a mask plate A.

A direction indicated by an arrow as illustrated in FIG. 4 represents a direction in which the ultraviolet light rays illuminate. After the illumination by the ultraviolet light rays, a material of a portion of the transfer layer a3 located in an exposure region B is transformed from alkyl sulfhydryl into alkane sulfonate, while a material of the other portion of the transfer layer a3 located in a non-exposure region remains to be alkyl sulfhydryl.

A third step: impregnating the whole structure which was subject to exposure into ionized water, so as to remove the alkane sulfonate located in the exposure region B of the transfer layer a3 and then to form a plurality of transfer units a4, thus obtaining a transfer template.

Figure 5:
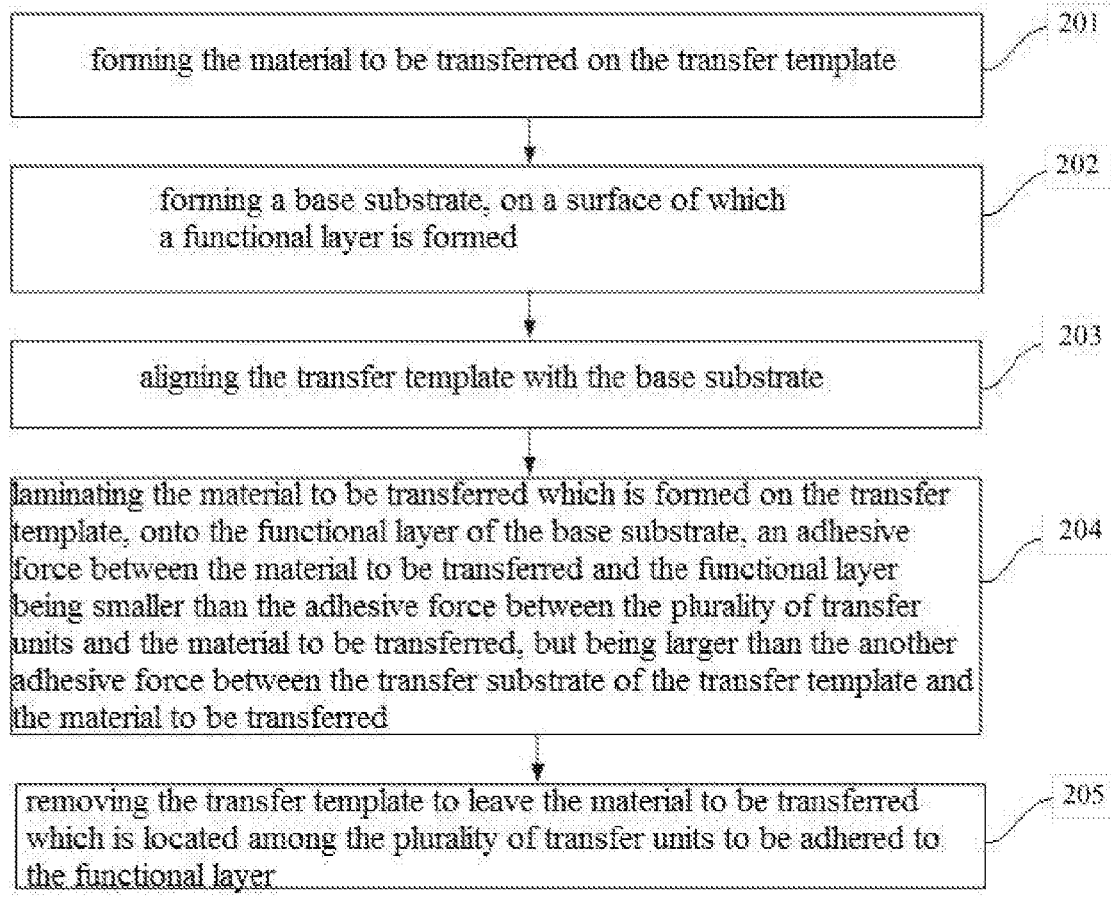
FIG. 5 illustrates a flow chart of a method for manufacturing a display substrate according to an embodiment of the disclosure.

In still another aspect of the embodiments of the disclosure, a method for manufacturing a display substrate is further provided. As illustrated in FIG. 5, the method for manufacturing a display substrate comprises:

Step S201: forming the material to be transferred on the transfer template manufactured in aforementioned embodiment of the disclosure.

The material to be transferred is formed on the transfer template, covering both the plurality of transfer units of the transfer template and the portion of the transfer substrate among the plurality of transfer units, and an adhesive force between the plurality of transfer units and the material to be transferred is larger than another adhesive force between the portion of transfer substrate located among the plurality of transfer units and the material to be transferred. A structure of the transfer template formed to have the material to be transferred is illustrated in FIG. 2.

There may for example be various ways for forming the material to be transferred on the transfer template, such as, spin-coating with a solution or a suspension liquid, a slot die coating and the like, so as to coat the material to be transferred onto the transfer template. In a condition that the spin-coating with a solution or a suspension liquid is used, specific sizes of the material to be transferred which was transferred onto the transfer template may for example be controlled by parameters such as concentration of the solution, a rotational speed during the spin-coating, and the like. And alternatively, in a condition that the slot die coating is adopted, specific sizes of the material to be transferred which was transferred onto the transfer template may for example be controlled by parameters such as quantity of flow, width being coated, and coating speed during the slot die coating, and the like. Specific types of the material to be transferred, the plurality of transfer units and the transfer substrate are introduced in detail as above, without repeating herein any more in the embodiment of the disclosure, i.e., specific types thereof may for example be set depending on practical conditions.

Step S202: forming a base substrate, on a surface of which a functional layer is formed.

Based on different types of the display substrate which is to be manufactured, in response to a condition in which the material to be transferred is formed on the transfer template, it is required to form a base substrate of a corresponding type which may be used to cooperate with the transfer template in subsequent processes (such as aligning, laminating/pressing-fit, and removal and adhesion and the like). A functional layer may be formed on a surface of the base substrate, and may for example be a structure layer being an intrinsic portion of original base substrate, or for example be another structure layer newly formed on the original base substrate, and specific choice in this connection will for example be made depending on practical conditions.

By way of example, in a condition that the display substrate to be manufactured is a QLED display substrate, then, the base substrate formed in this step is a quantum dot substrate, and the functional layer is for example a common material layer of the original quantum dot substrate, such as an electron-transporting material layer or a hole-transporting material layer. In a condition that the display substrate to be manufactured is a liquid crystal display substrate, the base substrate formed in this step is a color film substrate, and the functional layer is for example an additional material layer newly added on the original colr film substrate.

Step S203: aligning the transfer template with the base substrate.

By way of example, an alignment between the transfer template and the base substrate thus manufactured is implemented, e.g., by aligning a first alignment mark formed on the transfer template with a second alignment mark formed on the base substrate.

Step S204: laminating the material to be transferred which is formed on the transfer template, onto the functional layer of the base substrate, with a still another adhesive force between the material to be transferred and the functional layer being smaller than the adhesive force between the plurality of transfer units and the material to be transferred, but being larger than the another adhesive force between the transfer substrate of the transfer template and the material to be transferred.

By way of example, EQT refers to an adhesive force between the transfer substrate and the quantum dot layer which functions as the material to be transferred in the specific embodiment, EQC refers to an adhesive force between the functional layer and the quantum dot layer which functions as the material to be transferred in the specific embodiment, EQS refers to an adhesive force between the plurality of transfer units and the quantum dot layer which functions as the material to be transferred in the specific embodiment, EQQ refers to an adhesive force among the hydrophobic units in the quantum dot layer, and there exists a relationship among magnitudes thereof, i.e., EQT<EQC<EQS<EQQ.

In operation, for example, in a vacuum condition or in an inert gas (such as nitrogen, argon, and the like) atmosphere, the transfer template and the base substrate are aligned and laminated with each other, with a magnitude of a press applied during the lamination being determined depending on specific materials and structures of components.

For example, in a condition that the functional layer of the base substrate is a common material layer such as a hole-transporting material layer and the like, the plurality of transfer units carry functional amino groups positively charged, while the quantum dot layer carries the repeating units formed by phenylene ethynylene groups functioning as the functional ligands, or the repeating units formed by phenylene vinylidene groups functioning as the functional ligands, the functional ligands correspondingly carrying functional groups negatively charged, such as sulfonic acid groups, phosphoric acid groups, carboxylic acid groups and the like. Then, on the basis of above structures, a press applied for laminating the transfer template and the base substrate is for example 50-100 g/cm$^2$; and in this condition, there is an extremely high surface energy (also referred to as interface energy) between the quantum dot layer on the transfer template and the common material layer of the base substrate, e.g., up to 200 mJ/m$^2$. On the basis of the existence of the high surface energy between the quantum dot layer and the common material layer of the base substrate, the quantum dot layer is for example adhered onto the common material layer of the base substrate, and hereby a transfer of the quantum dot material from the transfer substrate of the transfer template to the common material layer of the base substrate is completed by said lamination.

The quantum dot material for example carries the functional ligands, and there may be various types of the functional ligands, e.g., the repeating units formed by one type of phenylene ethynylene groups and phenylene vinylidene groups, the repeating units being constructed in a form of conjugated chains, with specific number of monomers in each repeating unit being set depending on practical conditions; e.g., a repeating unit has 2-8 monomers therein. The functional ligands as above are for example functionalized by functional groups negatively charged, and there may for example be various types of the functional groups negatively charged, such as sulfonic acid groups, phosphoric acid groups, carboxylic acid groups, and the like, specific type of which may be set specifically depending on practical conditions.

Step S205: removing the transfer template to leave the material to be transferred which is located among the plurality of transfer units to be adhered to the functional layer.

Once the material to be transferred which is formed on the transfer template is laminated onto the functional layer of the base substrate, the material to be transferred and the functional layer are adhered to each other; and the laminating lasts over a time period, and then the transfer template is removed from the base substrate. As such, on the basis of above relationship among magnitudes of adhesive forces among the plurality of transfer units, the transfer substrate, the material to be transferred of the transfer template, and the functional layer of the base substrate, i.e., EQT<EQC<EQS<EQQ, then, the material to be transferred which is originally adhered on the portion of the transfer substrate among the plurality of transfer units may then be adhered and coated onto the functional layer of the base substrate, so as to implement the transfer of the material to be transferred onto the base substrate.

In the embodiment of the disclosure, in order to enhance the adhesive force between the plurality of transfer units and the material to be transferred, for example, the material to be transferred may be modified prior to forming the material to be transferred on the transfer template, such that the material to be transferred carries the second functional groups; and in response to a mutual contact between the plurality of transfer units and the material to be transferred, the first functional groups carried by the material of the plurality of transfer units and the second functional groups may attract each other. And on the basis of the effect of the attraction among functional groups, the adhesive force between the plurality of transfer units and the material to be transferred, such that the material to be transferred which originally covers and is adhered to the plurality of transfer units may not be transferred to the functional layer of the base substrate. In order to improve the hydrophobic property of the material to be transferred, for example, the material to be transferred may be set to carry hydrophobic units.

In a condition that the material to be transferred is the quantum dot material which carries both hydrophobic units and the second functional groups simultaneously, the second functional groups are for example located on the hydrophobic units; and in response to a mutual contact between the transfer template and the material to be transferred, the second functional groups carried by the quantum dot material and the first functional groups carried by the transfer template may attract each other. In order to prepare above material structure, in the embodiment of the disclosure, prior to implementing the step S201, for example, an original quantum dot material which originally carries neither hydrophobic structures nor second functional groups may be processed above all by a ligand-exchange reaction such that the quantum dot material carries hydrophobic units; and then, the quantum dot material carrying the hydrophobic units are modified such that the hydrophobic units carry the second functional groups.

And in a condition that the display substrate comprises various patterns of the material to be transferred, for example, various transfer templates each formed to have respective material to be transferred different from one another may be used sequentially, so as to form various patterns of the materials to be transferred on the functional layer of the base substrate which is located opposite to and laminated with these transfer templates. By way of example, the base substrate of the display substrate comprises a pattern of red quantum dots, a pattern of green quantum dots, and a pattern of blue quantum dots, for example, by using transfer templates each formed to have a corresponding one of a red quantum dot layer, a green quantum dot layer and a blue quantum dot layer, sequentially, so as to transfer the pattern of red quantum dots, the pattern of green quantum dots and the pattern of blue quantum dots onto the functional layer of the base substrate.

When the transfer template provided in the embodiment of the disclosure is used to transfer the quantum dot material onto the base substrate, for example, by decreasing sizes of the portion of the transfer substrate which is not covered by the plurality of transfer units, and in turn the quantum dot material of relatively small sizes may be transferred onto the base substrate, and in practice, patterns of quantum dots having sizes less than 5 μm may be transferred on to the base substrate, so as to obtain both a display substrate and a display panel of relatively high resolution. Furthermore, the patterns of the quantum dot material transferred onto the base substrate have properties such as clear edges, a uniform and relatively thin thickness of each film layer, and the like, such that the display substrate and the display panel as manufactured possess superior display properties.

In yet another aspect of the embodiments of the disclosure, a display substrate is further provided, which is manufactured by above method for manufacturing the display substrate according to above embodiment of the disclosure, and has characteristics such as relatively high resolution and the like.

In still yet another aspect of the embodiments of the disclosure, a display panel is further provided, which is obtained by assembling above display substrate according to above embodiment of the disclosure, and has characteristics such as relatively high resolution and the like.

In further another aspect of the embodiments of the disclosure, a display device is further provided, which comprises both a housing and the display panel according to above embodiment of the disclosure, which is accommodated within the housing, and has characteristics such as relatively high resolution and the like.

In order to ensure that the method for manufacturing the display substrate according to the embodiment of the disclosure may be understood more readily and clearly by those skilled in the art, at present, the method for manufacturing the display template may be set forth in detail by following exemplary embodiments.

In an Exemplary Embodiment of the Disclosure

Figure 6:
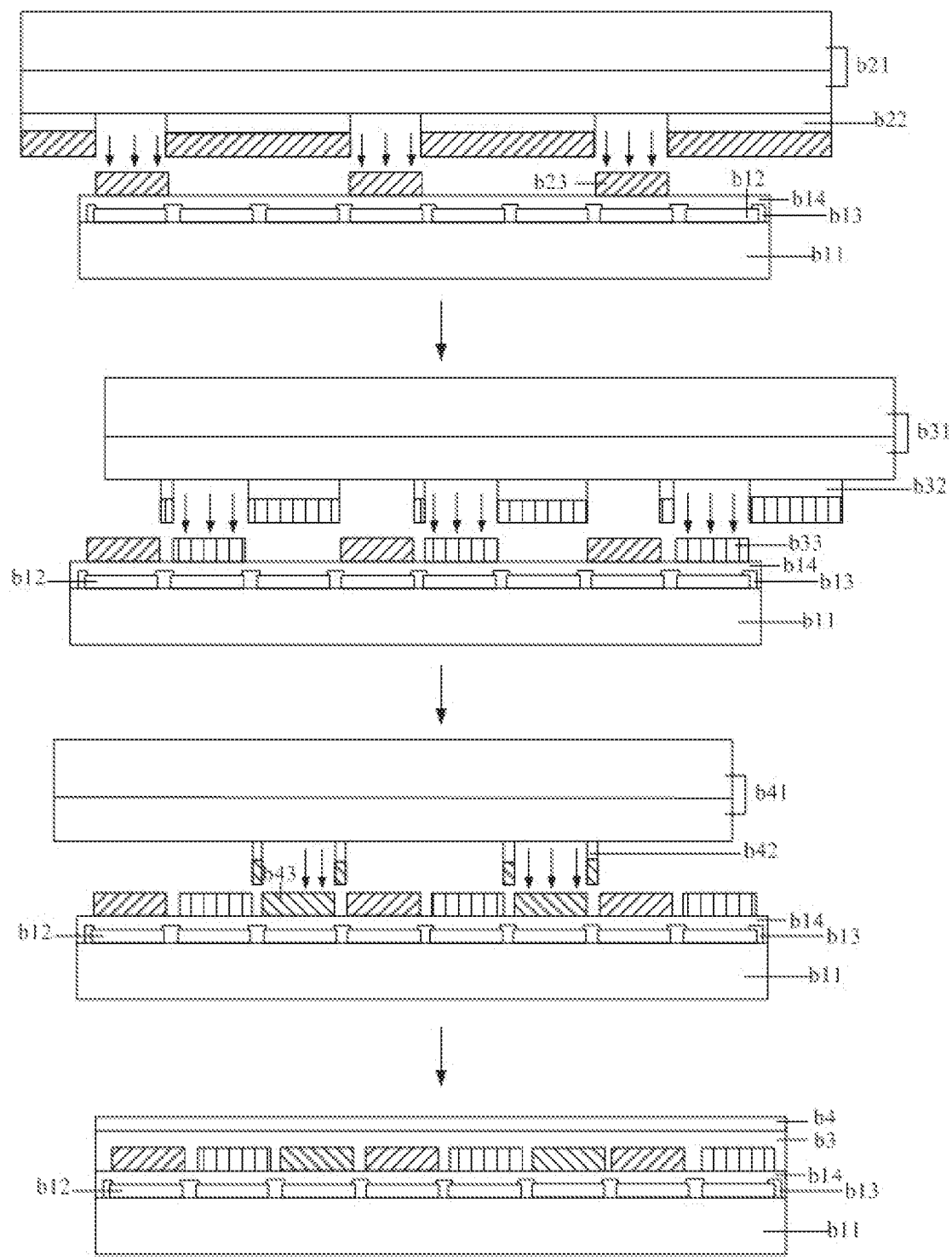
FIG. 6 illustrates a schematic view of workflows of the method for manufacturing a display substrate according to the embodiment of the disclosure.

Specifically, the method for manufacturing the display substrate is provided herein. As illustrated in FIG. 6, the method for manufacturing the display substrate as provided herein comprises following steps:

In step 1, forming a base substrate, a first transfer template, a second transfer template, and a third transfer template.

As illustrated in FIG. 6, the base substrate comprises a substrate layer labeled 'b11', an anode labeled 'b12' which is arranged in an array after patterning, a pixel definition layer labeled 'b13' and a hole injection material layer/hole transport material layer labeled 'b14'.

As shown in a first drawing from top to bottom of the FIG. 6, a first transfer template comprises a first transfer substrate labeled 'b21' and a plurality of first transfer units labeled 'b22' which are formed on the first transfer substrate. On the first transfer template as illustrated in FIG. 6, a red quantum dot layer labeled 'b23' is formed, which functions as a first material layer to be transferred which covers both the plurality of first transfer units b22 and a naked/bareness portion of the first transfer substrate located among the plurality of first transfer units b22, and then the portion of the first material layer b23 to be transferred which is located on the naked/bareness portion of the first transfer substrate may in turn be transferred and laminated onto the base substrate.

Figure 7:
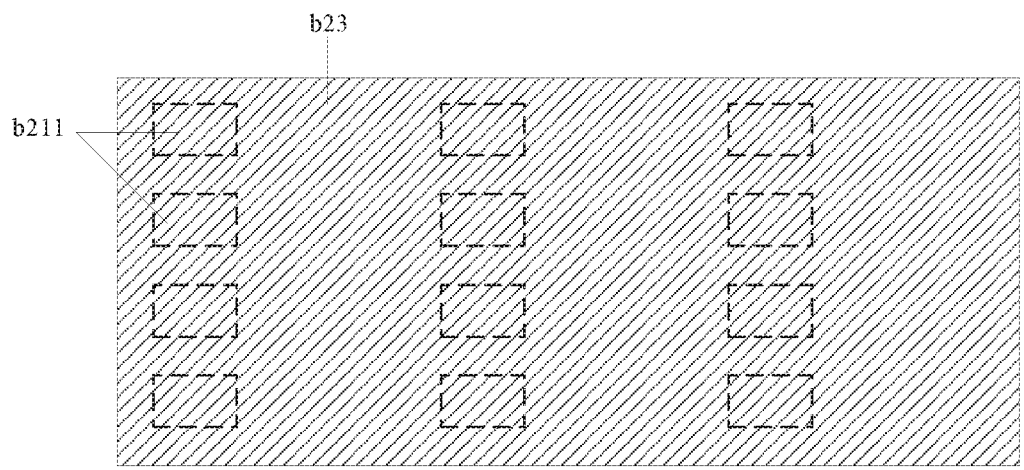
FIG. 7 illustrates a schematic structural view of a first transfer template according to an embodiment of the disclosure.

FIG. 7 illustrates a top view of the first transfer template formed in the embodiment, and regions which are delimited and defined within dotted bordered boxes and indicated by mark b211 in FIG. 7 refer to the naked/bareness portion of the first transfer substrate which are located among and not covered by the plurality of first transfer units 'b22', as illustrated.

As shown in a second drawing from top to bottom of the FIG. 6, the aforementioned first transfer template is removed and a second transfer template is used as an alternative to align with the base substrate, said second transfer template as illustrated comprising a second transfer substrate labeled 'b31' and a plurality of second transfer units labeled 'b32' which are formed on the second transfer substrate 'b31'. On the second transfer template as illustrated in FIG. 6, a green quantum dot layer labeled 'b33' is formed, which functions as a second material layer to be transferred which covers both the plurality of second transfer units b32 and a naked/bareness portion of the second transfer substrate b31 located among the plurality of second transfer units b32, and then the portion of the second material layer b33 to be transferred which is located on the naked/bareness portion of the second transfer substrate may in turn be transferred and laminated onto the base substrate, as illustrated. The portion of the green quantum dot layer b33 located on regions of the second transfer template being aligned with the portion of the red quantum dot layer b23 which has been already transferred on to the base substrate, is then etched away.

Figure 8:
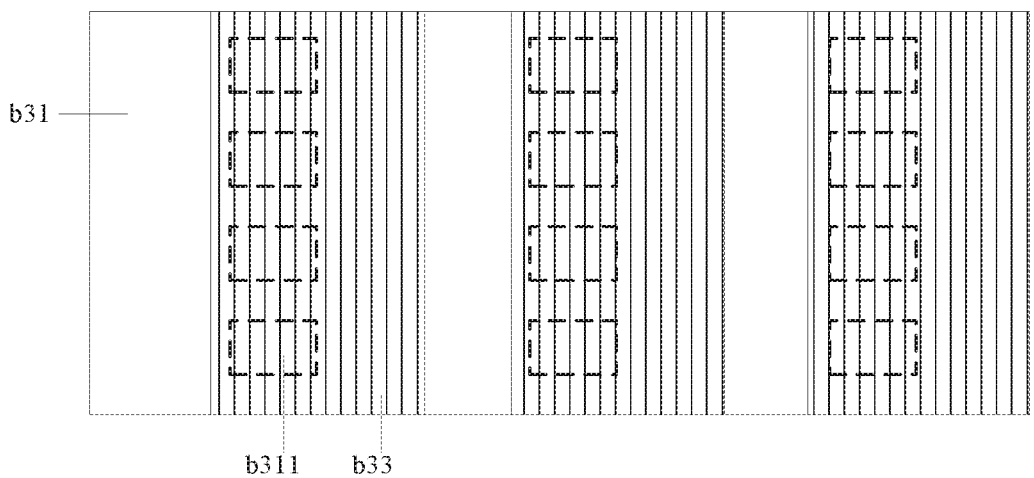
FIG. 8 illustrates a schematic structural view of a second transfer template according to an embodiment of the disclosure.

FIG. 8 illustrates a top view of the second transfer template formed in the embodiment, and regions which are delimited and defined within dotted bordered boxes and indicated by mark b311 in FIG. 8 refer to the naked/bareness portion of the second transfer substrate which are located among and not covered by the plurality of second transfer units 'b32', as illustrated.

As shown in a third drawing from top to bottom of the FIG. 6, the aforementioned second transfer template is removed and a third transfer template is used as an alternative to align with the base substrate, said third transfer template as illustrated comprising a third transfer substrate labeled 'b41' and a plurality of third transfer units labeled 'b42' which are formed on the third transfer substrate 'b41'. On the third transfer template as illustrated in FIG. 6, a blue quantum dot layer labeled 'b43' is formed, which functions as a third material layer to be transferred which covers both the plurality of third transfer units b42 and a naked/bareness portion of the third transfer substrate b41 located among the plurality of third transfer units b42, and then the portion of the third material layer b43 to be transferred which is located on the naked/bareness portion of the third transfer substrate may in turn be transferred and laminated onto the base substrate, as illustrated. The portion of the blue quantum dot layer b43 located on regions of the third transfer template being aligned with the portion of the red quantum dot layer b23 which has been already transferred on to the base substrate, is then etched away; and another portion of the blue quantum dot layer b43 located on regions of the third transfer template being aligned with the portion of the green quantum dot layer b33 which has been already transferred on to the base substrate, is also etched away.

Figure 9:
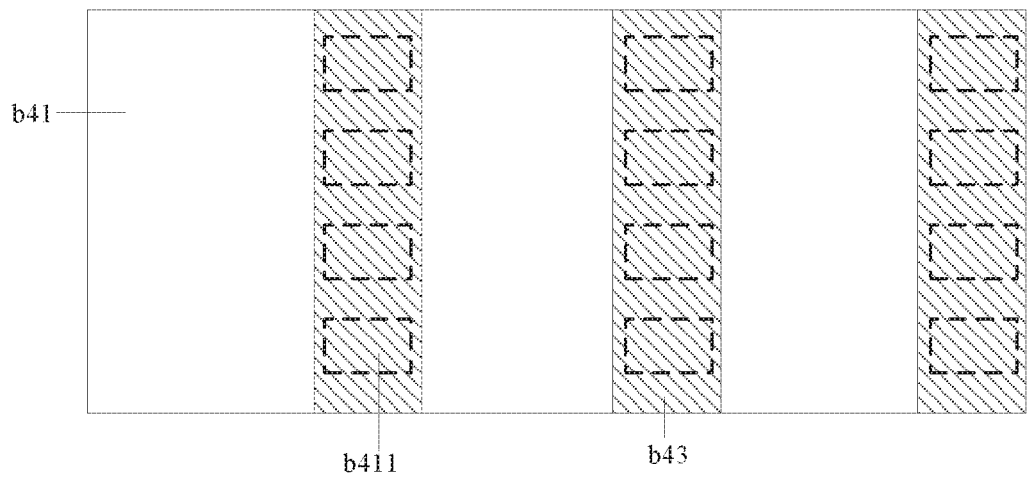
FIG. 9 illustrates a schematic structural view of a third transfer template according to an embodiment of the disclosure.

FIG. 9 illustrates a top view of the third transfer template formed in the embodiment, and regions which are delimited and defined within dotted bordered boxes and indicated by mark b411 in FIG. 9 refer to the naked/bareness portion of the third transfer substrate which are located among and not covered by the plurality of third transfer units 'b42', as illustrated.

By above specific settings of the three transfer templates as illustrated in FIG. 6 (specifically, first three drawings listed from top to bottom of the FIG. 6) and FIGS. 7-10 corresponding thereto respectively, the three transfer templates are used sequentially to transfer the three different quantum dot layers, respectively, facilitating transferring the three quantum dot layers sequentially onto designated locations of the base substrate. On the basis of the mechanism in transferring of the transfer template(s) according to the embodiment of the disclosure, for example, specific structures of the transfer template(s) may be set depending on practical conditions, this embodiment being only taken as an example, without limiting in any sense.

In step 2, laminating the red quantum dot layer b23 of the first transfer template onto the hole transport material layer b14 of the base substrate, and removing the first transfer template. Then, on the basis of above relationship among magnitudes of adhesive forces among the plurality of transfer units, the transfer substrate, the material to be transferred, of the transfer template, and the functional layer (e.g., the hole transport material layer b14) of the base substrate, i.e., EQT<EQC<EQS<EQQ, then, a portion of the red quantum dot layer b23 located among the plurality of first transfer units b22, i.e., the portion of the red quantum dot layer b23 which is located on a naked/bareness portion of the first transfer substrate b211, is adhered to the hole transport material layer b14 of the base substrate, while the other portion of the red quantum dot layer b23 which is aligned and adhered to the plurality of first transfer units b22 still remains adhered to the plurality of first transfer units b22 and are in turn removed away with the removal of the plurality of first transfer units b22.

In step 3, laminating the green quantum dot layer b33 of the second transfer template onto the hole transport material layer b14 of the base substrate, and removing the second transfer template. Then, on the basis of above relationship among magnitudes of adhesive forces among the plurality of transfer units, the transfer substrate, the material to be transferred, of the transfer template, and the functional layer (e.g., the hole transport material layer b14) of the base substrate, i.e., EQT<EQC<EQS<EQQ, then, a portion of the green quantum dot layer b33 located among the plurality of second transfer units b32, i.e., the portion of the green quantum dot layer b33 which is located on a naked/bareness portion of the second transfer substrate b311, is adhered to the hole transport material layer b14 of the base substrate, while the other portion of the green quantum dot layer b33 which is aligned and adhered to the plurality of second transfer units b32 still remains adhered to the plurality of second transfer units b32 and are in turn removed away with the removal of the plurality of second transfer units b32.

In step 4, laminating the blue quantum dot layer b43 of the third transfer template onto the hole transport material layer b14 of the base substrate, and removing the third transfer template. Then, on the basis of above relationship among magnitudes of adhesive forces among the plurality of transfer units, the transfer substrate, the material to be transferred, of the transfer template, and the functional layer (e.g., the hole transport material layer b14) of the base substrate, i.e., EQT<EQC<EQS<EQQ, then, a portion of the blue quantum dot layer b43 located among the plurality of third transfer units b42, i.e., the portion of the blue quantum dot layer b43 which is located on a naked/bareness portion of the third transfer substrate b411, is adhered to the hole transport material layer b14 of the base substrate, while the other portion of the blue quantum dot layer b43 which is aligned and adhered to the plurality of third transfer units b42 still remains adhered to the plurality of third transfer units b42 and are in turn removed away with the removal of the plurality of third transfer units b42.

Finally, as illustrated in a fourth drawing from top to bottom of the FIG. 6, then, the portion of the first material layer b23 to be transferred (i.e., the red quantum dot layer b23) which is located on the naked/bareness portion of the first transfer substrate, the portion of the second material layer b33 to be transferred (i.e., the green quantum dot layer b33) which is located on the naked/bareness portion of the second transfer substrate, and the portion of the third material layer b43 to be transferred (i.e., the blue quantum dot layer b43) which is located on the naked/bareness portion of the third transfer substrate, are all laminated as illustrated onto the hole transport material layer of the base substrate, and hereby R, G, B quantum dot layers (i.e., red, green, and blue quantum dot layers) are formed on the hole transport material layer of the base substrate.

In step 5, forming an electron-transporting material layer labeled 'b3', on the quantum dot layer.

In step 6, forming a cathode labeled 'b4' on the electron-transporting material layer b3.

As to an inversion structure of the device as illustrated in FIG. 6, the electrode on the base substrate is for example a cathode; a material layer formed on the cathode is an electron transport layer, and another material layer formed on the quantum dot layer is a hole injection layer or hole transport layer, on which an anode is formed.

In Another Exemplary Embodiment of the Disclosure

Figure 10:
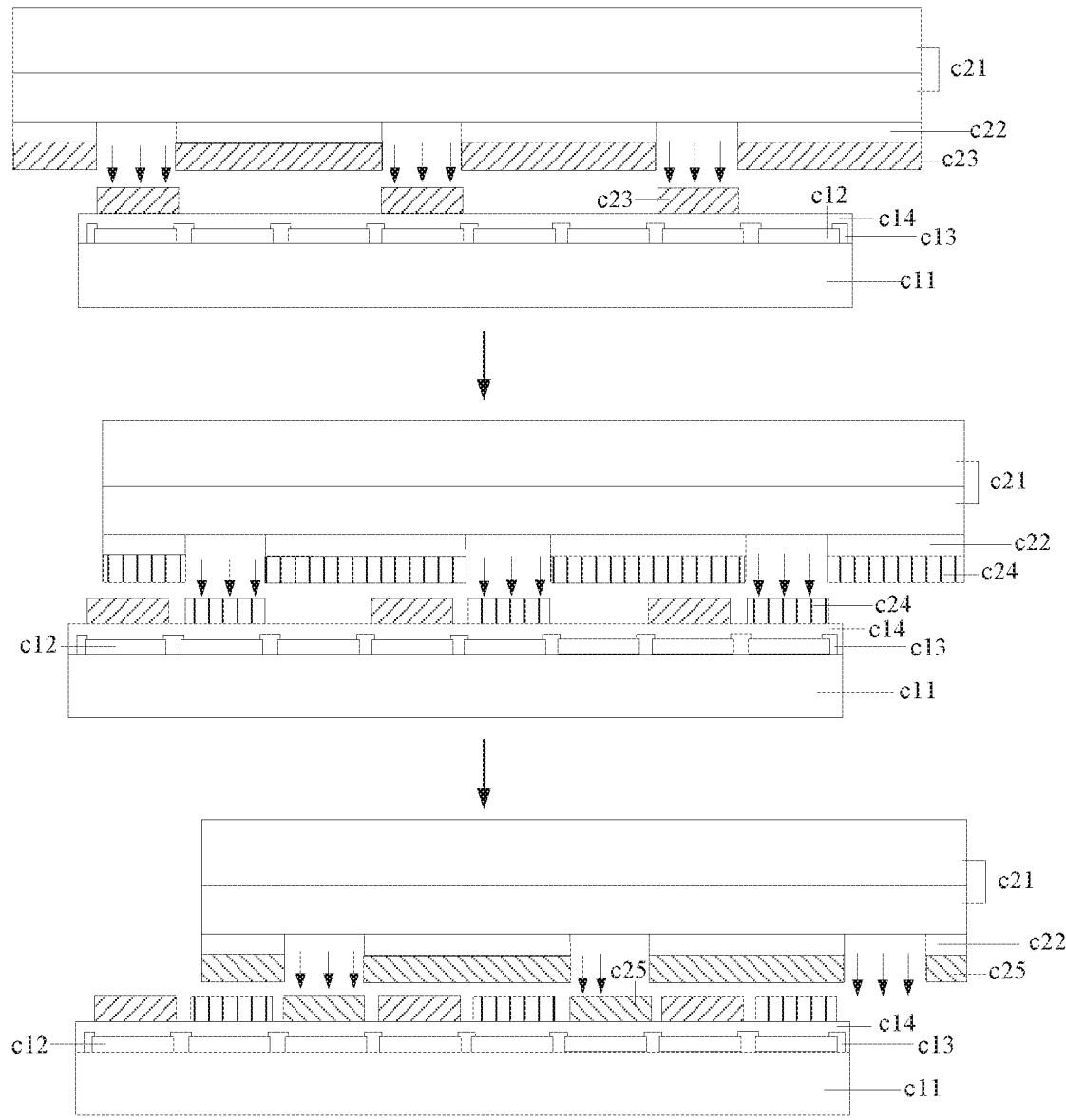
FIG. 10 illustrates a schematic view of workflows of a method for manufacturing another display substrate according to an embodiment of the disclosure.

Specifically, the method for manufacturing the display substrate is provided herein. As illustrated in FIG. 10, the method for manufacturing the display substrate as provided herein comprises following steps:

In step 1', forming a base substrate, and a transfer template.

As illustrated in FIG. 10, the base substrate comprises a substrate layer labeled 'c11', an anode labeled 'c12' which is arranged in an array after patterning, a pixel definition layer labeled 'c13' and a hole injection material layer/hole transport material layer labeled 'c14'. The transfer template comprises the transfer substrate c21 and a plurality of transfer units labeled 'c22' on the transfer substrate.

When the transfer template is used to transfer a red quantum dot layer c23 onto a base substrate, the red quantum dot layer c23 is formed on the transfer template, the red quantum dot layer c23 functioning as a first material layer to be transferred which covers both the plurality of transfer units c22 and a naked/bareness portion of the transfer substrate located among the plurality of transfer units c22. By various steps of aligning the transfer template with the base substrate, laminating the red quantum dot layer c23 of the transfer template onto the hole injection material layer/hole transport material layer c14, and removing the transfer template, the portion of the red quantum dot layer c23 located among the plurality of transfer units 22 is transferred onto the base substrate.

In a condition that the various quantum dot layers to be transferred are arranged in a certain regularity of arrangement, for example, one and the same transfer template is used to transfer other quantum dot layer(s), such as green quantum dot layer c24 and blue quantum dot layer c25, as illustrated; in other words, all the quantum dot layers are sequentially transferred by one and the same transfer template, so as to simplify design of patterns of the transfer template. By way of example, in a condition that these three quantum dot layers (i.e., the red quantum dot layer, the green quantum dot layer, and the blue quantum dot layer) to be transferred are arranged uniformly at regular intervals and spaced apart from one another, and a distance between any two adjacent portions of the red quantum dot layer is equal to a distance between any two adjacent portions of the green quantum dot layer, and a distance between any two adjacent portions of the green quantum dot layer is equal to a distance between any two adjacent portions of the blue quantum dot layer; and in such an arrangement, the one and the same transfer template may for example be used to transfer above three quantum dot layers.

Specifically, once the transferring of the red quantum dot layer c23 is completed, for example, the transfer template is rinsed by washing. And then the green quantum dot layer c24 is formed on the rinsed transfer template by transferring thereto, during which the alignment between positions of both the transfer template and the base substrate may be changed and the transfer template is required to be moved to a predetermined position, such that the portion of the green quantum dot layer c24 located among the plurality of transfer units is adhered onto designated locations of the base substrate. Specific process of such transferring may refer to the process of transferring the red quantum dot layer c23 as above.

Similarly, once the transferring of the green quantum dot layer c24 is completed, for example, the transfer template is rinsed by washing. And then the blue quantum dot layer c25 is formed on the rinsed transfer template by transferring thereto, during which the alignment between positions of both the transfer template and the base substrate may be changed once again and the transfer template is required to be moved to another predetermined position, such that the portion of the blue quantum dot layer c25 located among the plurality of transfer units is adhered onto designated locations of the base substrate. Specific process of such transferring may refer to the process of transferring the red quantum dot layer c23 as above. The direction indicated by an arrow in FIG. 10 is a direction in which each quantum dot layer falls down.

There are several advantageous technical effects brought about by the technical solutions as provided in embodiments of the disclosure compared with relevant technology, as below:

A transfer template, a display substrate, a display panel, and a method for manufacturing the same are provided according to embodiments of the disclosure. The transfer template comprises a transfer substrate and a plurality of transfer units arranged on the transfer template and spaced apart from one another, and an adhesive force between the plurality of transfer units and the material to be transferred is set to be larger than another adhesive force between a portion of the transfer substrate among the plurality of transfer units and the material to be transferred. When the transfer template is used to transfer the material to be transferred, a portion of the material to be transferred which is aligned with and adhered to the plurality of transfer units with a relatively strong adhesive force therebetween still remain adhered onto the plurality of transfer units, while the other portion of the material to be transferred which is aligned with and adhered to the transfer substrate with a relatively week adhesive force therebetween is then transferred onto a target object. Based on above mechanism of transferring, for example, by adjusting a pattern and sizes of the portion of the transfer substrate which is not covered by the plurality of transfer units, a pattern and sizes of the material to be transferred which is already transferred onto the target object may be varied. At the same time, by the processing as above, the pattern of the material to be transferred which is already transferred onto the target object has properties such as clear edges, a uniform and relatively thin thickness of each film layer.

When the transfer template provided in the embodiment of the disclosure is used to transfer the quantum dot material onto the base substrate, for example, by decreasing sizes of the portion of the transfer substrate which is not covered by the plurality of transfer units, and in turn the quantum dot material of relatively small sizes may be transferred onto the base substrate, so as to obtain both a display substrate and a display panel of relatively high resolution. Furthermore, the patterns of the quantum dot material transferred onto the base substrate have properties such as clear edges, a uniform and relatively thin thickness of each film layer, and the like, such that the display substrate and the display panel as manufactured possess superior display properties.

Various embodiments of the present disclosure have been illustrated progressively, the same or similar parts of which can be referred to each other or one another. The differences among these various embodiments are described in emphasis.

The transfer template, the display substrate, the display panel and the method for manufacturing the same are illustrated in detail as above in embodiments of the disclosure, by using specific exemplary embodiments to set forth principles and implementations thereof, only intending to assist in understanding the methods and core concept thereof in embodiments of the disclosure.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A transfer template configured to transfer a material to be transferred, comprising:
   a transfer substrate; and
   a plurality of transfer units arranged on the transfer substrate and spaced apart from one another,
   wherein an adhesive force between the plurality of transfer units and the material to be transferred is configured to be larger than another adhesive force between the transfer substrate and the material to be transferred,
   wherein gaps are formed between adjacent ones of the plurality of transfer units to space them apart from one another, and are filled up with the material to be transferred,
   wherein a material of the plurality of transfer units carries first functional groups, and the material to be transferred carries second functional groups, and the plurality of transfer units are configured to be in contact with the material to be transferred, and the first functional groups and the second functional groups attract each other, and
   wherein the material to be transferred is a quantum dot material, the first functional groups are one type of amino groups and zirconium ionic groups, and the second functional groups are one type of sulfonic acid groups, phosphoric acid groups, and carboxylic acid groups.

2. The transfer template according to claim 1, wherein the transfer template comprises a base layer and a metallic layer stacked on each other, with the plurality of transfer units being on a side of the metallic layer facing away from the base layer.

3. The transfer template according to claim 2, wherein the plurality of transfer units collectively function as a self-assembled monolayer film.

4. The transfer template according to claim 3, wherein the self-assembled monolayer film is a self-assembled thiol molecular film.

5. The transfer template according to claim 1, wherein the material to be transferred further carries hydrophobic units on which the second functional groups are located, and the hydrophobic units comprise repeating units formed by one type of phenylene ethynylene groups and phenylene vinylidene groups.

6. A method for manufacturing a transfer template, the transfer template being configured to transfer a material to be transferred, comprising:
   forming a transfer substrate; and
   forming a plurality of transfer units arranged on the transfer substrate and spaced apart from one another,
   wherein an adhesive force between the plurality of transfer units and the material to be transferred is set to be larger than another adhesive force between the transfer substrate and the material to be transferred,
   wherein gaps are formed between adjacent ones of the plurality of transfer units to space them apart from one another, and are filled up with the material to be transferred,
   wherein a material of the plurality of transfer units carries first functional groups, and the material to be transferred carries second functional groups, and the plurality of transfer units are configured to be in contact with the material to be transferred, and the first functional groups and the second functional groups attract each other, and
   wherein the material to be transferred is a quantum dot material, the first functional groups are one type of amino groups and zirconium ionic groups, and the second functional groups are one type of sulfonic acid groups, phosphoric acid groups, and carboxylic acid groups.

7. The method according to claim 6, wherein forming the transfer template comprises:
   providing a base layer; and
   forming a metallic layer on the base layer,
   wherein the plurality of transfer units are formed on the metallic layer.

8. The method according to claim 7, wherein forming a plurality of transfer units comprises:
   forming a transfer layer on the metallic layer; and
   forming the plurality of transfer units by patterning the transfer layer.

9. A method for manufacturing a display substrate, comprising:
   forming the material to be transferred on a transfer template comprising:
      a transfer substrate; and
      a plurality of transfer units arranged on the transfer substrate and spaced apart from one another, wherein an adhesive force between the plurality of transfer units and the material to be transferred is configured to be larger than another adhesive force between the transfer substrate and the material to be transferred;
   forming a base substrate on a surface of which a functional layer is formed;
   aligning the transfer template with the base substrate;
   laminating the material to be transferred which is formed on the transfer template, onto the functional layer of the base substrate; and
   removing the transfer template to leave the material to be transferred which is located among the plurality of transfer units to be adhered to the functional layer,
   wherein a third adhesive force between the material to be transferred and the functional layer is set to be smaller than the adhesive force between the plurality of transfer units and the material to be transferred, and to be larger than the another adhesive force between the transfer substrate of the transfer template and the material to be transferred, and
   wherein gaps are formed between adjacent ones of the plurality of transfer units to space them apart from one another, and are filled up with the material to be transferred.

10. The method according to claim 9, wherein a material of the plurality of transfer units carries first functional groups and the material to be transferred is a quantum dot material, and prior to forming the material to be transferred on the transfer template, the method further comprising:
   processing the quantum dot material by a ligand-exchange reaction such that the quantum dot material carries hydrophobic units; and
   modifying the quantum dot material carrying the hydrophobic units such that the hydrophobic units carry second functional groups,
   wherein in response to the plurality of transfer units being in contact with the material to be transferred, the first functional groups and the second functional groups attract each other.

11. The method according to claim 10, wherein the functional layer is one of an electron-transporting material layer and a hole-transporting material layer.

12. A display substrate manufactured by the method according to claim 9.

13. A display panel, comprising:
a housing; and
the display substrate according to claim 12, which is accommodated within the housing.

* * * * *